United States Patent [19]
Naem et al.

[11] Patent Number: 5,866,459
[45] Date of Patent: Feb. 2, 1999

[54] METHOD OF FABRICATING A CONTACT STRUCTURE FOR AN MOS TRANSISTOR ENTIRELY ON ISOLATION OXIDE

[75] Inventors: Abdalla Aly Naem, Sunnyvale; Mohsen Shenasa, Pleasanton, both of Calif.

[73] Assignee: National Semiconductor Corporation, Santa Clara, Calif.

[21] Appl. No.: 803,118

[22] Filed: Feb. 20, 1997

[51] Int. Cl.$^6$ .................................................. H01L 21/336
[52] U.S. Cl. .......................... 438/300; 438/303; 438/307; 438/306; 438/491
[58] Field of Search .................................... 438/297, 300, 438/303, 306, 305, 491, 692, 307

[56] References Cited

U.S. PATENT DOCUMENTS

| | | |
|---|---|---|
| 5,079,180 | 1/1992 | Rodder et al. . |
| 5,496,750 | 3/1996 | Moslehi . |
| 5,677,214 | 10/1997 | Hsu . |
| 5,683,924 | 11/1997 | Chan et al. . |

OTHER PUBLICATIONS

C.T. Liu, et al., "MOSFET's with One–Mask Sealed Diffusion–Junctions for ULSI Applications", IEEE Electron Device Letters, vol. 16, No. 8, Aug. 1995.

T.M. Liu, et al., "An Ultra High Speed ECL–Bipolar CMOS Technology with Silicon Fillet Self–aligned Contacts", IEEE Symposium on VLSI Technology Digest of Technical Papers, pp. 30–31, 1992.

T.M. Liu, et al., "A Half–micron Super Self–aligned BiCMOS Technology for High Speed Applications", IEEE, pp. 2.2.1–2.2.4, 1992.

T.M. Liu, et al., "The Control of Polysilicon/Silicon Interface Processed by Rapid Thermal Anneal", IEEE, pp. 263–266, 1991.

Tzu–Yin Chiu, et al., "Non–overlapping Super Self–Aligned BiCMOS with 87ps Low Power ECL", IEEE, pp. 752–755.

*Primary Examiner*—Trung Dang
*Attorney, Agent, or Firm*—Limbach & Limbach LLP

[57] ABSTRACT

A MOS transistor structure is provided in which the source/drain contacts are to raised polysilicon and are located entirely over field isolation. Contact integrity is maintained because the contact is located on field oxide, rather than in direct contact with the substrate junction diffusion area. Conventional contact metal spiking into the junction area is also eliminated. Contact overetch during formation of the contact opening can be increased to insure a clean contact surface because the contact is made to the raised poly regions. Furthermore, the contact barrier is no longer essential for maintaining contact reliability, because the contact is located away from the active junction.

3 Claims, 4 Drawing Sheets

METHOD OF FABRICATING A CONTACT STRUCTURE FOR AN MOS TRANSISTOR ENTIRELY ON ISOLATION OXIDE

BACKGROUND OF THE INVENTION

1. Field of the Invention

The present invention relates to fabrication techniques for integrated circuit elements and, in particular, to a process flow for fabricating a MOSFET that utilizes raised source/drain contacts formed entirely over isolation oxide.

2. Discussion of the Related Art

FIG. 1 shows a conventional MOSFET transistor 10 fabricated in an active device region of a semiconductor wafer substrate, the active device region being defined by field oxide regions. In fabricating the MOSFET 10, a layer of polysilicon is formed on a layer of thin oxide that is formed on the substrate active device region. The polysilicon layer is then masked and both the exposed polysilicon and the underlying thin oxide are etched to define a polysilicon gate region 12 separated from the substrate by thin gate oxide 14. A self-aligned implant of N-type dopant then forms lightly doped diffusion (LDD) source/drain regions in the substrate as a first phase in forming the substrate N+ source/drain regions of the MOSFET. After the formation of oxide sidewall spacers (SWS) 15 on the sidewalls of the polysilicon gate 12 and the gate oxide 14, a second N+ implant is performed to set the conductivity of the gate region 12 to a desired level and to complete the N+ source/drain regions 16. Titanium is then deposited on the exposed upper surfaces of the N+ source/drain regions 16 and the polysilicon gate region 12 and annealed, thereby causing the titanium to react with the underlying N+ silicon of the substrate source/drain regions 16 and the doped polysilicon gate 12 to form titanium salicide 18 on these surfaces. A layer of dielectric material 20, typically silicon oxide, is then formed, contact openings are etched in the dielectric 20, and a metallization layer 22 is formed to provide contacts to the salicide 18 on the source/drain regions 16 and on the polysilicon gate 12.

The above-described MOSFET fabrication technique suffers from potential problems in the formation of source/drain regions 16. First, selective growth of the salicide needed for good contacts with the metallization layer requires a reaction between the titanium and underlying silicon. Therefore, the titanium must be formed on the N+ source/drain regions 16, which must be wide enough to accommodate the photolithographic limitations of the contact opening; this results in a wider device. Also, since silicon is consumed in the process, the junction depth of the N+ source/drain regions 16 is difficult to control and dopant depletion can occur in these regions. Furthermore, formation of the deep, heavily-doped N+ junction for the source/drain regions 16 can result in dopant diffusion under the gate region, thereby reducing the effective channel length of the MOSFET, i.e., the so-called "short channel effect." Also, due to the poor selectivity between the salicide and the oxide, the salicide may be removed during the contact etch process, leading to contact resistance and leakage current problems.

SUMMARY OF THE INVENTION

The present invention provides a novel structure for an MOS transistor in which the source/drain contact is made to raised polysilicon and is located entirely over trench field isolation. Contact integrity is no longer a major issue, because the contact is located on the field oxide and is no longer in direct contact with the substrate junction diffusion area. Conventional contact metal spiking into the junction area is also eliminated. The contact overetch during formation of the contact opening can be increased without difficulties due to silicon removal because the contact is made to the raised poly, not to the substrate. Furthermore, since the contact is located away from the active junction, a contact barrier is no longer essential for maintaining contact reliability.

More specifically, a preferred embodiment of the present invention provides a method of fabricating a MOSFET device structure in a silicon substrate wherein the MOSFET device structure includes planarized trench isolation field oxide regions formed in the substrate, a layer of gate oxide formed on the substrate to electrically insulate a polysilicon gate from the substrate, oxide sidewall spacers formed on sidewalls of the polysilicon gate and the gate oxide, and LDD N– regions formed in the substrate adjacent the field oxide regions and beneath the sidewall spacers to define a channel region in the substrate beneath the polysilicon gate. In accordance with the preferred method, a layer of polysilicon is deposited on the above-defined structure and a chemical mechanical polishing (CMP) step is performed to form raised source/drain polysilicon regions that are self-aligned to the LDD N– regions. The CMP step exposes the upper surface of the undoped polysilicon gate. N-type dopant is then implanted into the gate and into the raised source/drain poly regions. Following a rapid thermal processing (RTP) step that activates the N– implant and diffuses N-type dopant from the raised source/drain poly regions into the underlying LDD N– regions to form N+ contact regions, a layer of cobalt is deposited on the doped poly gate and on the raised source/drain poly regions. Heavy ions are then implanted into the cobalt layer to mix the cobalt at the cobalt/poly interface and to break any contamination film at this interface. A titanium-nitride film is then formed on the cobalt and a second RTP step is performed to form cobalt salicide on the raised source/drain poly regions and on the poly gate. After unreacted cobalt is removed, a layer of dielectric material is formed over the entire structure and contact openings are formed in the dielectric layer to be entirely over the trench oxide isolation regions and to expose the salicide on the raised source/drain poly regions. A conductive contact layer is then formed to provide electrical contact to the source/drain salicide. Electrical contact to the salicided poly gate is formed at the same time that the source/drain contacts are established.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

A process flow for fabricating a MOSFET device in accordance with the present invention will now be described in conjunction with the partial cross-sectional drawings provided in FIGS. 2A–2L. While no specific process parameters are provided, those skilled in the art will appreciate that the concepts of the invention are applicable regardless of these parameters, which will differ depending upon the specific integrated circuit structure under manufacture. Those skilled in the art will also appreciate that, while the following discussion is directed to the fabrication of N-channel devices, the concepts of the invention apply to all MOSFET technologies.

Figure 1:
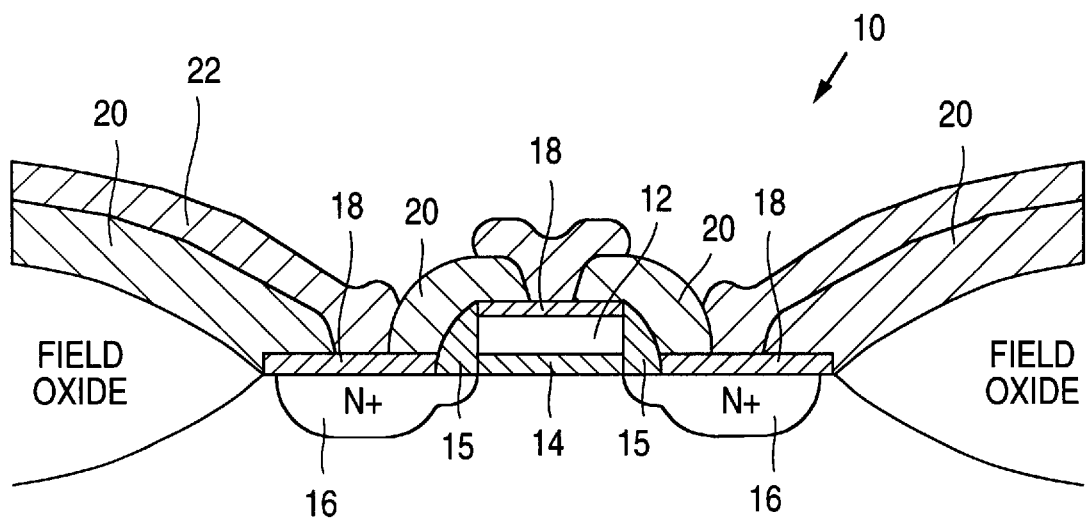
FIG. 1 is a partial cross-sectional drawing illustrating a conventional MOSFET design.
Figure 2A:
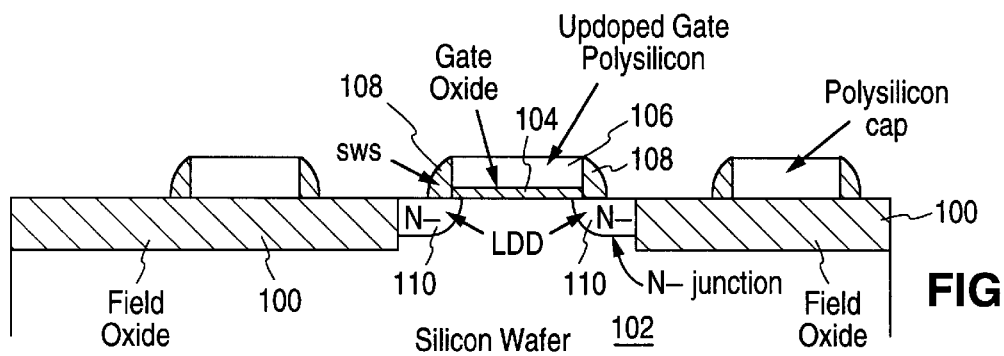
FIGS. 2A–2L are partial cross-sectional drawings illustrating a sequence of steps for fabricating a raised source/drain MOSFET contact structure in accordance with the concepts of the present invention.

The initial fabrication sequence proceeds in a conventional manner through the formation of the trench isolation structure shown in FIG. 2A. As shown in FIG. 2A, conventional planarized trench isolation field oxide regions 100 are formed in a silicon wafer 102. A layer of thin gate oxide 104 is formed on the substrate 102 to electrically insulate an undoped polysilicon gate 106 from the substrate 102. Oxide sidewall spacers (SWS) 108 are formed on the sidewalls of the polysilicon gate 106 and gate oxide 104. Low density diffusion (LDD) N– regions 110 are formed in the substrate 102 adjacent field oxide regions 100 and beneath the sidewall spacers 108 to define a channel region in the substrate 102 beneath the polysilicon gate 106.

As further shown in FIG. 2A, the first layer of polysilicon can also be utilized in the formation of polysilicon capacitors and resistors on the field oxide regions 100.

Figure 2B:
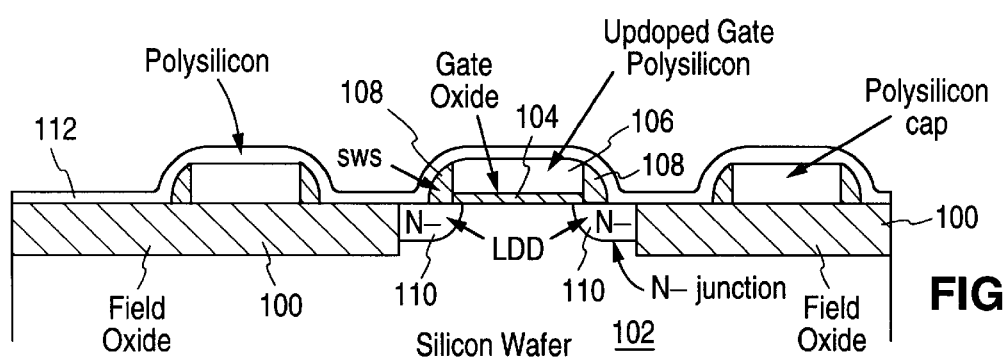
Figure 2C:
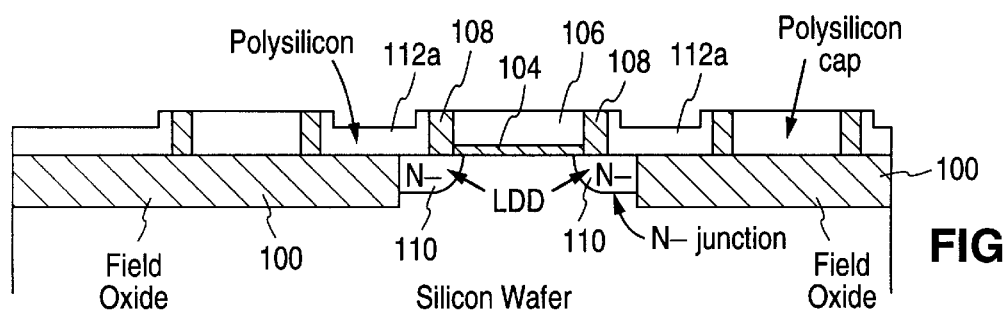

As shown in FIG. 2B, a layer of polysilicon film 112 is then deposited over the FIG. 2A structure and a chemical mechanical polishing (CMP) step is performed to self-align the polysilicon film 112 to the N– source/drain regions 110, resulting in the structure shown in FIG. 2C. While FIG. 2C shows self-aligned poly regions 112a that are not fully planarized with, for example, the upper surface of the poly gate 106, those skilled in the art will appreciate that the original thickness of the poly layer 112 can be chosen so that the CMP step results in a fully planarized structure.

Figure 2D:
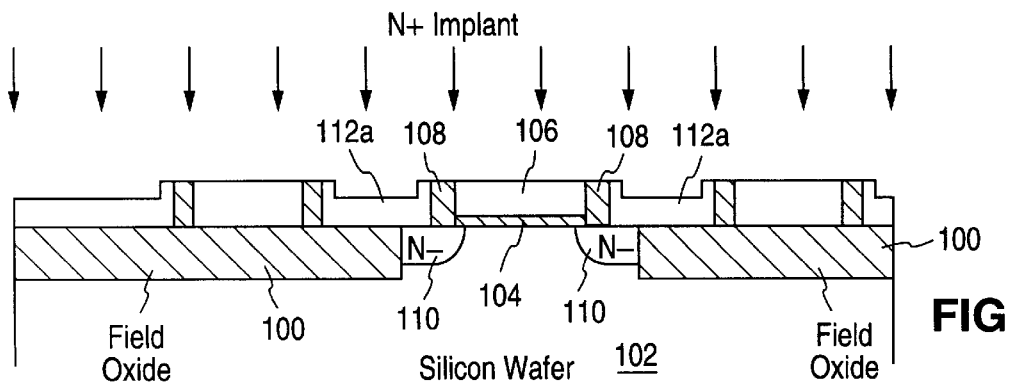

As shown in FIG. 2D, an N+ dopant, preferably arsenic, is then implanted into the gate polysilicon 106 and the raised source/drain polysilicon regions 112a to dope these regions of exposed polysilicon to a desired conductivity level.

Figure 2E:
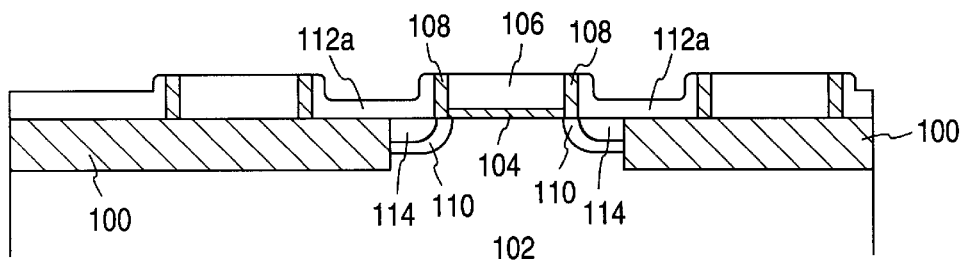

A rapid thermal processing (RTP) step is then performed to activate the N+ implant and to diffuse the arsenic to form the N+ junction 114 in the N– LDD source/drain regions 110, resulting in the structure shown in FIG. 2E.

Figure 2F:
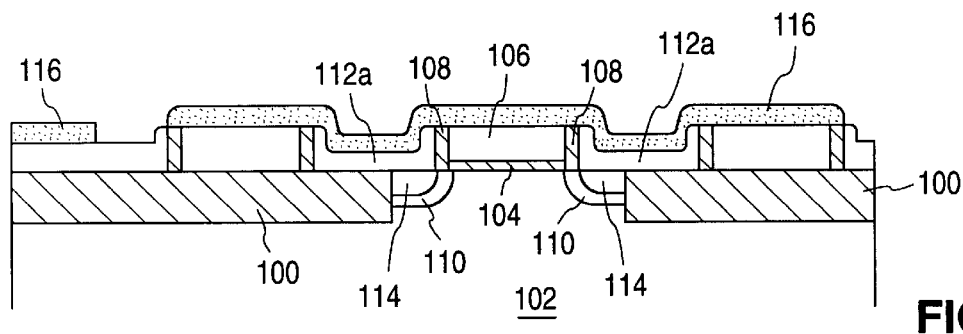

Next, as shown in FIG. 2F, a photoresist mask 116 is defined over the FIG. 2E structure to pattern the thin film resistor (TFR) and at the same time protect the source/drain polysilicon regions 112a. Unwanted polysilicon is then etched and the photoresist mask 116 is removed, resulting in the structure shown in FIG. 2G.

Figure 2G:
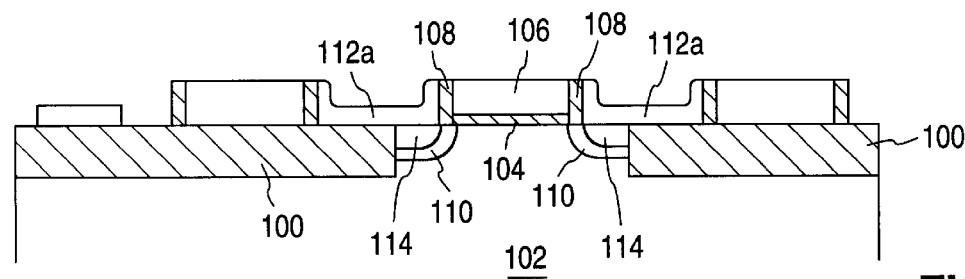
Figure 2H:
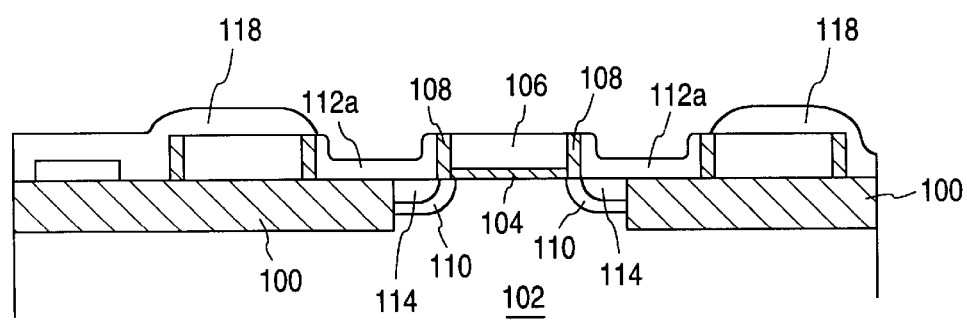

Next, a salicide oxide exclusion mask layer is formed and etched to protect the FIG. 2G structure with the exception of the photoresist source/drain regions 112a and the polysilicon gate 106, as shown in FIG. 2H.

Figure 2I:
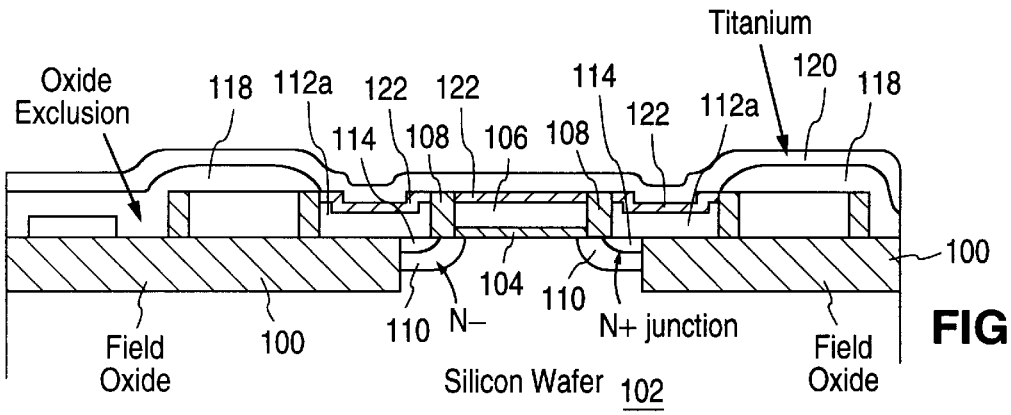
Figure 2J:
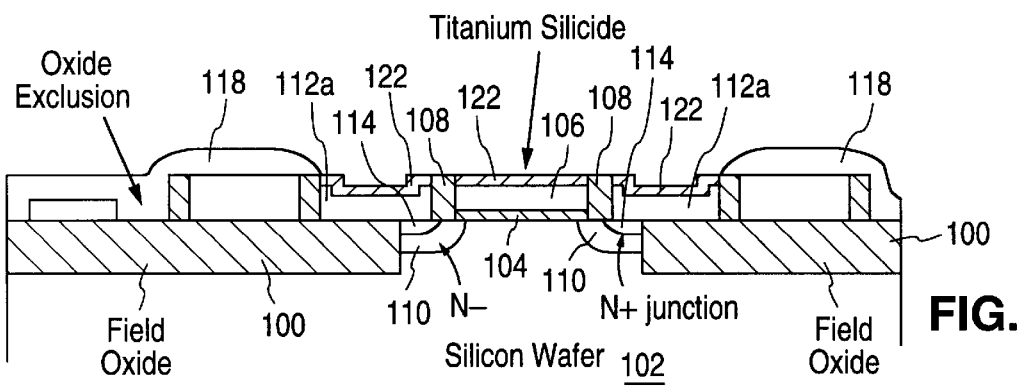

As shown in FIG. 2I, a cobalt film is then deposited over the FIG. 2H structure in ultra high vacuum, preferably about $10^{-9}$ Torr. The ultra high vacuum will remove contaminants from the deposition ambient and, therefore, result in pure cobalt film and, therefore, high quality salicide film. Subsequently, the cobalt film is implanted with heavy ions at high energy, preferably arsenic at 5E14 $cm^{-2}$ and 100 KeV, to mix the Co/Si interface in order to break the native oxide or any contaminant film at the interface, thereby making the salicidation process much easier. A TiN film 120 is then deposited to protect the cobalt film from nitrogen diffusion during RTP, thereby producing a highly uniform salicide layer due to the absence of foreign material in the cobalt film. The TiN film will also result in reducing the RTP thermal budget. A rapid thermal processing (RTP) step is then performed to form salicide 122 on the raised source/drain polysilicon regions 112a and the polysilicon gate region 106. The TiN film is removed prior to removing unreacted cobalt in an Al-type or other suitable etch. The unreacted cobalt film is then removed using a wet selective etch, resulting in the structure shown in FIG. 2J.

A third RTP step is performed at this point to form the final stable low resistance salicide phase.

Cobalt salicide 122 offers high etching selectivity to oxides and, therefore, is not removed during subsequent contact etch. This improves the contact resistance and the contact reliability. The use of highly selective cobalt salicide also protects the top capacitor plate from being penetrated during the contact etch, since this is the shallowest contact in the structure and, therefore, will be subjected to the most overetch in comparison to the source/drain contacts. Thus, the use of cobalt salicide makes the "inside" capacitor structure easier to implement.

Figure 2K:
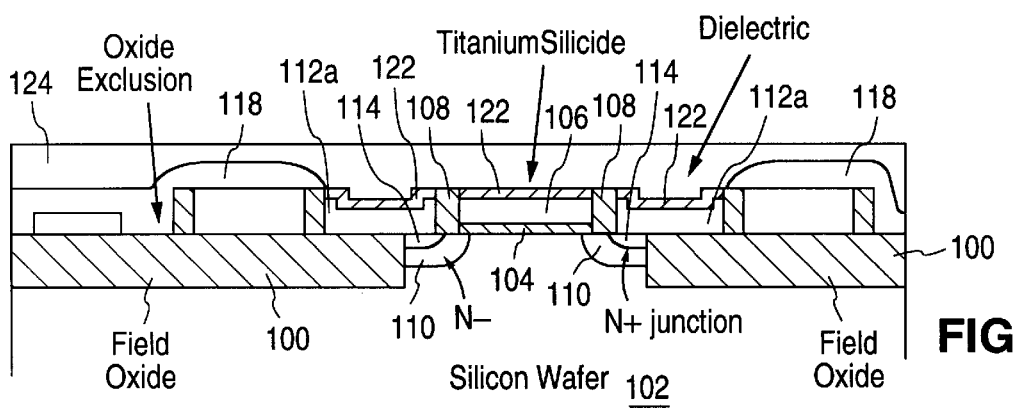

After removal of the unwanted cobalt, a dielectric layer 124, typically deposited CVD oxide, is deposited and a chemical mechanical polishing (CMP) step is performed to planarize the structure, as shown in FIG. 2K.

Figure 2L:
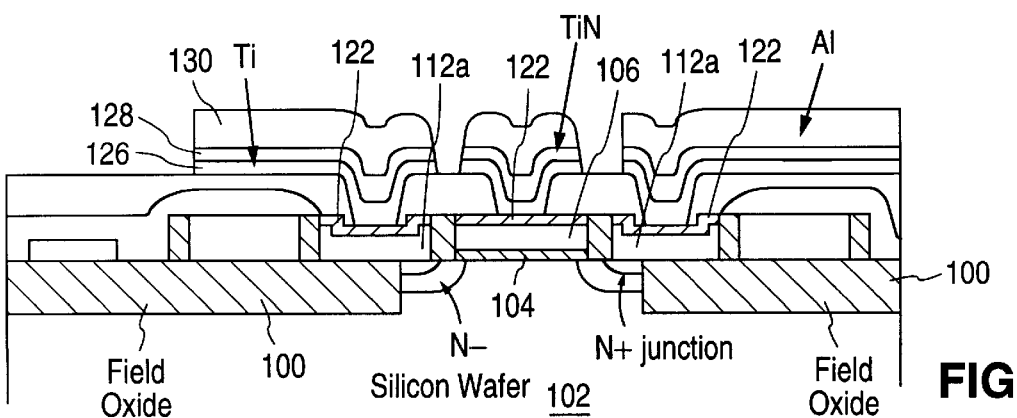

Finally, as shown in FIG. 2L, contact holes are opened in the dielectric layer 124 and a metallization structure is deposited to form contacts with the cobalt salicide 122 formed on the raised source/drain regions 112a and on the polysilicon gate 106. As shown in FIG. 26, the contacts to the raised source/drain poly regions 122/112a are formed entirely over the trench field oxide isolation regions 100. In the embodiment of the invention illustrated in FIG. 2L, the contact metallization includes a first layer of titanium 126, a second layer of titanium nitride 128 and a final layer of aluminum 130.

It should be understood that various alternatives to the embodiments of the invention described herein may be employed in practicing the invention. It is intended that the following claims define the scope of the invention and methods and structures within the scope of these claims and their equivalents be covered thereby.

What is claimed is:

1. A method of fabricating a MOSFET device structure in a silicon substrate, wherein the MOSFET device structure includes planarized trench isolation field oxide regions formed in the substrate, a layer of gate oxide formed on the substrate to electrically insulate a polysilicon gate from the substrate, oxide sidewall spacers formed on sidewalls of the polysilicon gate and gate oxide, LDD N– regions formed in the substrate adjacent the field oxide regions and beneath the sidewall spacers to define a channel region in the substrate beneath the polysilicon gate, the method comprising the steps of:

depositing a layer of polysilicon on the above-defined structure;

performing a chemical mechanical polishing step to form raised source/drain polysilicon regions that are self-aligned to the LDD N– regions;

implanting N-type dopant into the polysilicon gate and into the raised source/drain polysilicon regions;

performing a first rapid thermal processing (RTP) step to activate the N-type dopant implant and to diffuse N-type dopant from the raised source/drain polysilicon regions into the underlying LDD N– regions;

depositing a layer of cobalt on the polysilicon gate and on the raised source/drain polysilicon regions;

implanting heavy ions into the cobalt layer to mix the cobalt and silicon at the interface of the cobalt layer and the underlying polysilicon;

forming a TiN film on the cobalt layer;

performing a second RTP step to form cobalt salicide on the raised source/drain polysilicon regions and on the polysilicon gate;

removing unreacted cobalt;

performing a third RTP step to form a stable salicide phase;

forming a layer of dielectric material on the structure resulting from the above-recited steps;

forming contact openings in the dielectric layer entirely over the trench field oxide isolation regions to expose the cobalt salicide on the raised source/drain polysilicon regions and on the polysilicon gate;

forming a conductive contact layer in the contact openings, and in electrical contact with the cobalt salicide on the raised source/drain polysilicon regions and on the polysilicon gate.

2. A method as in claim 1 and wherein the N-type dopant implanted into the polysilicon gate and into the raised source/drain polysilicon regions is arsenic.

3. A method as in claim 1 and wherein the heavy ions implanted into the cobalt layer comprise arsenic.

* * * * *